United States Patent [19]

Koyama et al.

[11] Patent Number: 4,597,228
[45] Date of Patent: Jul. 1, 1986

[54] VACUUM SUCTION DEVICE

[75] Inventors: Isao Koyama; Toshikazu Hatsuse, both of Tokyo, Japan

[73] Assignee: Citizen Watch Co., Ltd., Tokyo, Japan

[21] Appl. No.: 671,676

[22] Filed: Nov. 15, 1984

[30] Foreign Application Priority Data

Dec. 19, 1983 [JP] Japan .............................. 58-195273[U]

[51] Int. Cl.$^4$ .............................................. B24B 47/00
[52] U.S. Cl. ....................................... 51/235; 51/131.5
[58] Field of Search ...................... 51/283 R, 323, 235, 51/216 R, 216 LP, 216 T, 131.5

[56] References Cited

U.S. PATENT DOCUMENTS 4,521,995  6/1985  Sekiya .................................... 51/235

FOREIGN PATENT DOCUMENTS 180026  10/1983  Japan .................................... 51/235

Primary Examiner—Frederick R. Schmidt
Assistant Examiner—J. T. Zatarga
Attorney, Agent, or Firm—Koda and Androlia

[57] ABSTRACT

A vacuum suction device comprises a vacuum suction plate formed by baking a porous material and having a flat suction face for holding a workpiece by suction; a base abutting on a bottom of the vacuum suction plate for supporting the vacuum suction plate and having a plurality of suction grooves in a part of a surface of the base abutting on the bottom of the suction plate, the suction grooves being coupled to a pipe of the base; an intake device coupled to the pipe of the base; a peripheral member formed of an airtight material for encircling the suction plate; and means for preventing a grinding liquid from getting into the vacuum suction device through the suction grooves. The preventing means prevents reduction in suction force applied by the intake device acting on the workpiece.

3 Claims, 4 Drawing Figures

VACUUM SUCTION DEVICE

BACKGROUND OF THE INVENTION

1. Field of the Invention

This invention relates to a vacuum suction device for holding, by suction, parts to be ground (workpieces) such as a semiconductor wafer and a glass plate on the face of a suction plate.

2. Description of the Prior Art

When precision grinding is done or accurate measurement is made on silicon wafers for integrated circuits, glass plates for liquid crystal display devices, or other parts, they are held on a clamp by suction. This type of clamping methods include those for holding parts by suction on a metal suction plate having grooves or holes therein (not shown) and for holding parts by suction on a suction plate formed of porous material (FIGS. 1 and 2).

However, for example, when grinding a silicon wafer, the method in which some roughness such as grooves and holes is formed in a metal suction face will cause a gap between the suction face and the silicon wafer. As a result, the wafer is locally deformed, and at the time of cutting operation, the wafer's dimensions are fouled up or its surface becomes uneven. For example, when grinding a wafer with a thickness of 0.1 mm to 0.5 mm, depressing the wafer from the above causes it to curve downward in the grooves, and if grinding is done as it is, the portions of the wafer positioned in the grooves will swell out and appear on the surface when the depression is released. This cannot be neglected for wafer grinding which requires a high degree of flatness, for example, within ±5 μm.

On the other hand, the method using a porous material as a suction plate is, for example, shown in FIGS. 1 and 2. FIG. 1 shows the case where suction grooves 15, 16 and 17 are provided in a portion of a base 14 abutting on the bottom of a suction plate 11. The suction plate 11 is formed of porous material surrounded around its outer periphery by an airtight material such as metal (a part of the base 14). On the upper surface 11a of the suction plate 11, a workpiece 10 such as a wafer is held by suction. However, if a wafer is ground with the vacuum suction device thus constructed, grinding fluid gets into the vacuum suction device from the portion of the suction plate 11 which is not covered with the wafer 10 through the suction grooves 15, 16 and 17 and a pipe 18, thereby lowering the degree of vacuum and affecting the stability of suction force. Then, referring to FIG. 2, there is shown a suction plate 11 formed of porous material whose outer diameter is smaller than that of a wafer 10, and surrounded around the outer periphery thereof by an airtight material 11b. In this case, less grinding fluid is drawn into the vacuum suction device, and the clamping force is stable in comparison with the example shown in FIG. 1. However, the clamping force is reduced on the outer periphery of the wafer 10 which is not held by suction. This will reduce the grinding accuracy around the outer periphery of the wafer 10. In addition, since a material forming the suction plate 11 and a material forming the outer face 11b of the suction plate 11 are different, differences between them in thermal expansion and deformation by humidity sometimes distort the suction face 11a. Thus, this method gives a result similar to the above. And yet, when grinding the suction face 11a, the outer surface 11b formed of different material is ground simultaneously. This causes damage to a grinding wheel and a cutter.

Also, in the example shown in FIG. 2, another suction plate 11 is available whose outer periphery is formed of synthetic resin. In this case, there is the possibility that the resin comes up to the suction face 11a from the inner part of the porous suction plate 11, and as mentioned before, the suction face becomes uneven or deformed owing to the difference between both materials in expansion coefficient. In any case, no vacuum suction device has heretofore been available which is stable enough to permit holding workpieces such as a wafer by suction.

SUMMARY OF THE INVENTION

The object of this invention is to provide a vacuum suction device which is free of the aforementioned defects of the conventional vacuum suction devices and eliminates reduction in suction force and a nonstability, and which assures grinding accuracy especially around the outer periphery of a workpiece such as a wafer.

According to one aspect of the invention, there is provided a vacuum suction device comprising a vacuum suction plate formed by baking a porous material and having a flat suction face for holding a workpiece by suction; a base abutting on a bottom of the vacuum suction plate for supporting the vacuum suction plate and having a plurality of suction grooves in a part of the surface abutting on the bottom of the suction plate, the suction grooves being coupled to a pipe of the base; an intake device coupled to the pipe of the base; a peripheral member formed of an airtight material for encircling the suction plate; and means for preventing a grinding liquid from getting into the vacuum suction device through the suction grooves, thereby preventing reduction in suction force applied by the intake device acting on the workpiece.

According to another aspect of the invention, there is provided a vacuum suction device comprising a vacuum suction plate formed by baking a porous material and having a flat suction face for holding a workpiece by suction; a base abutting on a bottom of the vacuum suction plate for supporting the vacuum suction plate and having a plurality of suction grooves in a part of the surface abutting on the bottom of the suction plate, the suction grooves being coupled to a pipe of the base; an intake device coupled to the pipe of the base; a peripheral member formed of an airtight material for encircling the suction plate; and means for preventing a grinding liquid from getting into the vacuum suction device through the suction grooves; the preventing means permitting the suction face to substantially correspond to the workpiece in shape and being prepared by coating a mixture around the periphery of the suction plate so that the upper end of the periphery of the suction plate overlaps the bottom end of the workpiece, the mixture being made by mixing a bonding agent and an inorganic material having a grain size large enough to enter each of pores of the porous material and similar to the porous material in physical property, thereby preventing the suction plate from being exposed to the grinding liquid and preventing reduction in suction force applied by the intake device acting on the workpiece.

According to a further aspect of the invention, there is provided a vacuum suction device comprising a vacuum suction plate formed by baking a porous material and having a flat suction face for holding a workpiece by suction; a base abutting on a bottom of the vacuum suction plate for supporting the vacuum suction plate and having a plurality of suction grooves in a part of the surface of the base abutting on the bottom of the suction plate, the suction grooves being coupled to a pipe of the base; an intake device coupled to the pipe of the base; a peripheral member formed of an airtight material for encircling the suction plate; and means for preventing a grinding liquid from getting into the vacuum suction device through the suction grooves; the preventing means having water drawing grooves provided in a portion of the peripheral member encircling the suction plate, and a second intake device of another system coupled to the water drawing grooves so that water is drawn by the second intake device before the grinding liquid reaches the suction grooves abutting on the bottom of the suction plate, thereby preventing reduction in suction force applied by the intake device acting on the workpiece.

DETAILED DESCRIPTION OF THE PREFERRED EMBODIMENTS

Figure 3:
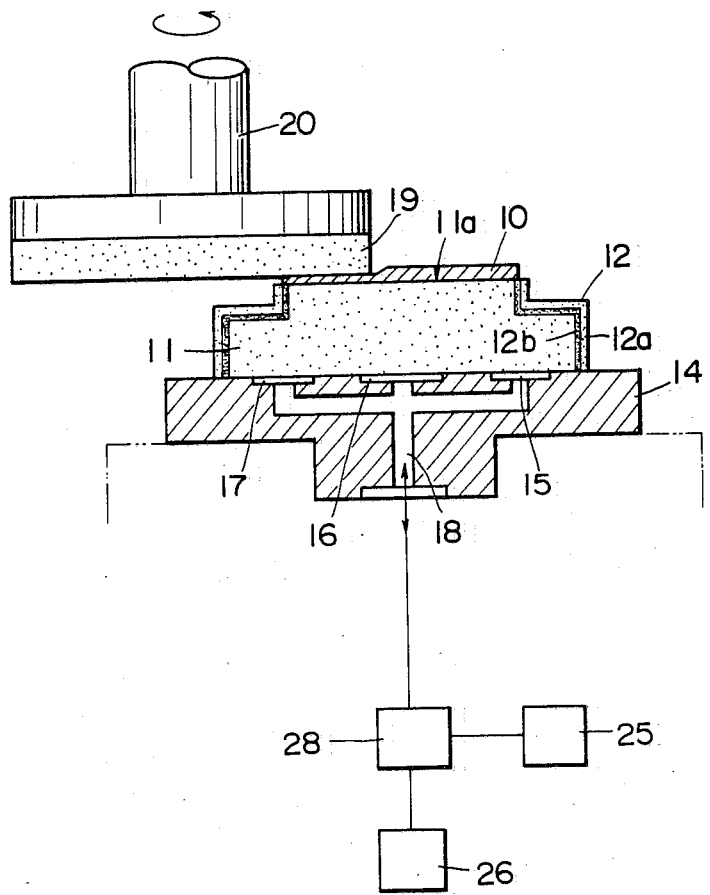
FIG. 3 is a sectional view of the main parts of a first embodiment of a vacuum suction device in accordance with the invention.

Referring to FIG. 3, there is shown a first embodiment carrying out the invention into a vacuum suction device for use in a grinding machine for grinding silicon wafers with extreme precision with a rotary grinding wheel composed of diamond abrasive grains.

In the figure, a cup-type rotary grinding wheel 19 rotates about a rotary shaft 20 at high speed. A silicon wafer 10 for mounting a plurality of ICs and LSIs at a given distance on its surface is held on a suction face 11a by suction. The surface of the wafer 10 should be ground precisely. Reference numeral 11 denotes a suction plate for holding the wafer 10 by suction. The suction plate 11 is built by use of inorganic material such as ceramic and glass material, and the vacuum suction face 11a thereon is ground flat so as not to allow any clearance between the face 11a and the mounted wafer 10.

The vacuum suction plate 11 is formed of coarse grit (No. 60 to No. 100) material, for example, Alundum, so as to allow a proper porosity. The periphery 12 of the vacuum suction plate 11 is formed of a mixture of inorganic grains and an adhesive or a bonding agent for a grinding wheel. The grain size is large enough to get into pores in the suction plate 11.

The present embodiment will now be described in detail. The vacuum suction plate 11 is integrally built of No. 80 grit to provide a porous one. For the periphery of the suction plate 11, green silicon carbide No. 3000 is selected as grains for getting into pores in the suction plate 11, as mentioned before, and mixed with an epoxy adhesive agent by a ratio of one to one. Then, the mixture is coated around the periphery of the suction plate 11 to form a thin film 12.

As already mentioned with respect to the prior art examples, when only the adhesive or bonding agent is used around the periphery of the vacuum suction plate 11, it may permeate into the inside of the suction plate 11 through pores or may float onto the suction face 11a. This is inconvenient for use as a vacuum suction plate. In contrast, according to the present embodiment, green silicon carbide No. 3000 blocks pores in the peripheral surface of the suction plate 11, thereby preventing the adhesive or bonding agent from permeating through the inside of pores. Thus, this thin film as shown provides sufficient air tightness.

In the joint between the vacuum suction plate 11 and a base 14 are formed grooves 15, 16 and 17 for air suction and washing. These grooves 15, 16 and 17 are switched to couple either an intake device 25 or a washing device 26 through a pipe 18, and serve for suction when the intake device 25 is in use, while serving for washing when the washing device 26 is in use, both through a switching device 28.

Although not shown, in order to inject water or the like for cooling and chip ejecting, a nozzle and such are provided in the position corresponding to the grinding position of the rotary grinding wheel 19, like a conventional structure.

In such a structure, when the intake device 25 operates, the grooves 15, 16 and 17 suck the air inside the vacuum suction plate 11 into the intake device 25. Thus, the wafer 10 is held by suction in the upper vacuum suction portion 11a by a substantially uniform force.

As mentioned before, the periphery 12 is formed of a nonporous film consisting of a layer 12a of green silicon carbide No. 3000 and a layer 12b formed by permeation of the adhesive agent. Furthermore, this film 12 is contact with the peripheric portion of the wafer 10 to prevent the grinding fluid from entering the suction plate 11. Therefore, the force of drawing air by the intake device 25 does not decrease, nor the suction action on the wafer is affected.

When grinding is finished, the intake device 25 is turned off to release the wafer 10. Next, washing water is discharged from the washing device 26. Then, the water is forced into the inside of the suction plate 11 through the pipe 18 to permit the wafer 10 to lift up from the suction portion 11a, thus making it easy to unload the wafer and wash chips and dirt particles contained in the pores.

As an adherent or bonding agent for a basis material forming the periphery 12, a sulfur or epoxy bonding agent may be used, as well as resin, bitrified and metal generally used for grinding wheels. The above bonding agents may be selected in accordance with the material of the inorganic vacuum suction plate forming the basis thereof.

Also, as inorganic abrasive grains, various kinds of compounds are available including oxide, carbide, silicide, nitride and boride. As mentioned above, the material having physical properties similar to those of the vacuum suction plate is selected for use.

As can be seen from the foregoing description, according to the structure of the first embodiment of this invention, to take an example of grinding a silicon wafer, the periphery 12 of a nonporous film is thin enough to hold the wafer 10 by suction at the vicinity of its very end, and, therefore, the wafer can withstand the unloading force applied when the grinding wheel touches the wafer 10 at the start of grinding, thereby making it possible to grind the wafer all over the surface with a high degree of accuracy.

Furthermore, since the vacuum suction plate and the periphery thereof are formed of materials physically similar to each other, there is little effect of thermal and humidity deformations, there is no possibility of damage to tools such as a grinding wheel even when finishing the suction face, and the suction face can be ground uniformly.

Figure 1:
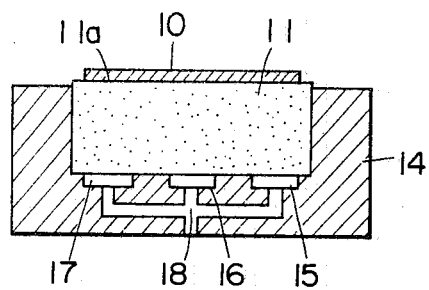
FIGS. 1 and 2 are sectional views of the main parts of conventional vacuum suction devices, repectively.
Figure 2:
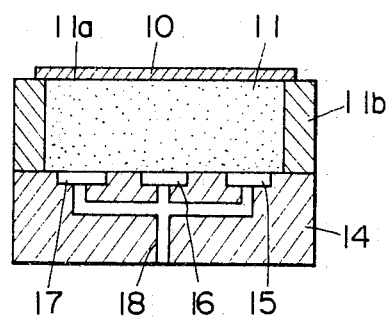
Figure 4:
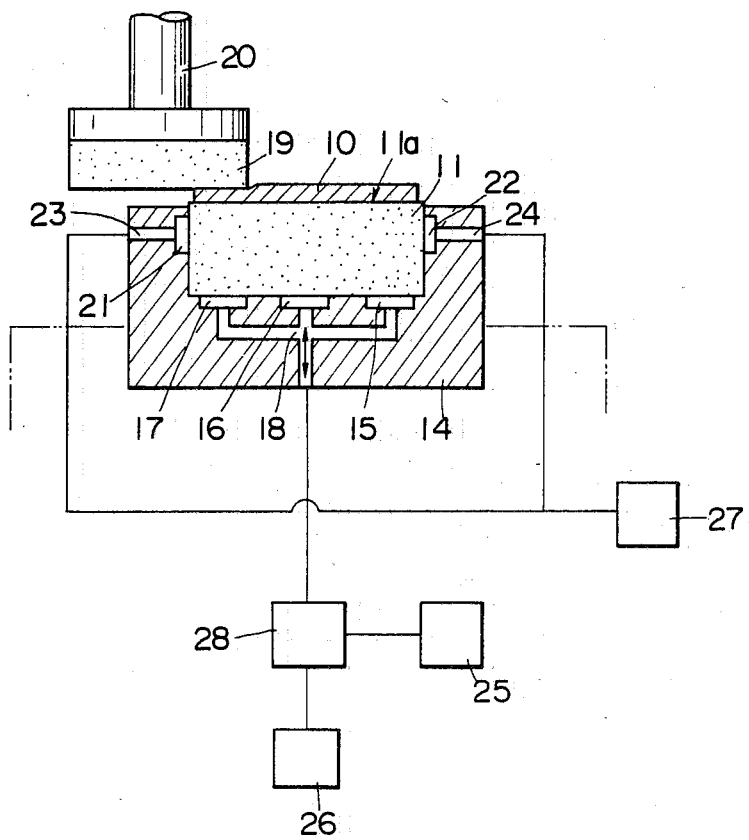
FIG. 4 is a sectional view of the main parts of a second embodiment of a vacuum suction device in accordance with the invention.

FIG. 4 shows a second embodiment carrying out this invention into a vacuum suction device for use in a grinding machine for grinding silicon wafers with a rotary grinding wheel composed of diamond abrasive grains. In the joint between the bottom of a vacuum suction plate 11 and a base 14 are formed grooves 15, 16 and 17 for air suction and washing, as in the first embodiment. These grooves 15, 16 and 17 are coupled to an intake device 25 and a washing device 26 through a pipe 18, and serve for suction when the intake device 25 is in use, while serving for washing when the washing device is in use. This embodiment has a structure in which the base 14 accommodates the vacuum suction plate 11 as in the prior art example shown in FIG. 1. In the inner joint of the base 14 surrounding the outer sides of the vacuum suction plate 11 are disposed grooves 21 and 22 for air suction and water intake. These grooves are coupled through pipes 23 and 24 to an intake device 27 in another system provided separately from the above-mentioned intake device 25. The grooves 21 and 22 may be a series of ring-shaped grooves encircling the suction plate 11. Both the intake devices 25 and 27 are also designed to provide the function of drawing water.

In addition, although not shown, in order to inject water or the like for cooling and chip ejecting, a nozzle and such are provided in the position corresponding to the grinding position of the rotary grinding wheel 19, like a conventional structure.

In such a structure, when the intake devices 25 and 27 operate, the grooves 15, 16 and 17 draw the air inside the vacuum suction plate 11. Thus, the wafer 10 is held by suction in the upper vacuum suction portion 11a by a substantially uniform force. During cutting, the grinding liquid being taken into the vacuum suction plate is drawn from the grooves 21, 22 and such into the intake device 27 of another system through the pipes 23 and 24 and is hardly drawn from the grooves 15, 16 and 17 for air suction and washing provided in the joint between the center portion of the vacuum suction plate 11 and the base 14, thereby preventing reduction in air suction function and keeping stability.

When grinding is finished, the intake device 25 is turned off to release the wafer 10. Next, washing water is discharged from the washing device 26. Then the water is forced into the inside of the suction plate 11 from the grooves 15, 16 and 17 through the pipe 18 to lift up the wafer 10 from the suction portion 11a, making it easy to unload the wafer and washing away chips and dirt particles in pores. This is the same as in the first embodiment.

As described above, according to the structure of the second embodiment of this invention, to take an example of grinding a silicon wafer, the vacuum suction plate 11 holds by suction the silicon wafer 10 not only on the entire surface but also on the sides thereof, and, therefore, the wafer 10 can withstand the unloading force applied when the grinding wheel touches the wafer 10 at the start of grinding, thus grinding the entire surface of the wafer with a high degree of accuracy.

Furthermore, since the grinding liquid is not drawn into the center portion of the suction plate, reduction in the air suction function is prevented and the fixture force is stable.

Also, since the grinding liquid which may contain chips and dirt particles is not drawn into the air suction and washing grooves provided in the inside and the bottom of the vacuum suction plate, the surface and the inside of the vacuum suction plate will not be contaminated during washing.

As will appear from the two embodiments, the vacuum suction device according to the invention is provided with a unique means for preventing the grinding liquid from being drawn from the grooves 15, 16 and 17, thus eliminating reduction in suction force applied by the intake device 25 acting on the workpiece 10 to be held and making the stable suction action possible. Especially, this invention solves the problems of the conventional device as a grinding machine for wafers. There is a great practical effect in the industrial field.

What is claimed is:

1. A vaccum suction device comprising:
   a vacuum suction plate formed by baking a porous material and having a flat suctin face for holding a workpiece by suction;
   a base abutting on a bottom of said vaccum suction plate for supporting said vacuum suction plate and having a plurality of suction grooves in a part of the surface abutting on the bottom of said suction plate, said suction grooves being coupled to a pipe of said base;
   an intake device coupled to the pipe of said base; and
   a peripheral member formed of an airtight material for encircling said suction plate, said peripheral member being formed by coating a mixture made by mixing a bonding agent and an inorganic material having a grain size large enough to block pores of said suction plate and similar to said porous material forming said suction plate in physical properties and a part of the peripheral member overlapping with the lower peripheral surface of the workpiece, thereby preventing a grinding liquid from splashing onto said suction plate and preventing a reduction in suction force applied by said intake device acting on said workpiece;

2. A vacuum suction device comprising:
   a vacuum suction plate formed by baking a porous material and having a flat suction face for holding a workpiece by suction;
   a base abutting on a bottom of said vacuum suction plate for supporting said vacuum suction plate and having a plurality of suction grooves in a part of the surface of said base abutting on the bottom of said suction plate, said suction grooves being coupled to a pipe of said base;
   an intake device coupled to the pipe of said base;
   a peripheral member formed of an airtight material for encircling said suction plate, said peripheral member having a plurality of grooves and connected to pipes for sucking both air and water, on the upper portion of said peripheral member and adjacent said vacuum suction plate; and
   a second intake device coupled to the pipes for sucking both air and water of said peripheral member;
   whereby most of the grinding liquid sucked into the vacuum suction plate is withdrawn from the grooves of the peripheral member via the pipes for sucking air and water into said second suction device to thereby prevent reduction in suction force applied by the intake device acting on the workpiece.

3. A vacuum suction device of claim 2 wherein said peripheral member is built integral with said base.

* * * * *